US006952363B2

(12) United States Patent
Song et al.

(10) Patent No.: US 6,952,363 B2
(45) Date of Patent: Oct. 4, 2005

(54) SEMICONDUCTOR MEMORY DEVICE WITH SELECTIVELY CONNECTABLE SEGMENTED BIT LINE MEMBER AND METHOD OF DRIVING THE SAME

(75) Inventors: Tae-Joong Song, Gyeonggi-do (KR); Tae-Hyoung Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/785,185

(22) Filed: Feb. 25, 2004

(65) Prior Publication Data

US 2004/0240300 A1 Dec. 2, 2004

(30) Foreign Application Priority Data

May 29, 2003 (KR) ................................. 10-2003-0034362

(51) Int. Cl.[7] ............................................... G11C 11/00
(52) U.S. Cl. .................... 365/154; 365/156; 365/230.05
(58) Field of Search ................................. 365/154, 156, 365/230.05

(56) References Cited

U.S. PATENT DOCUMENTS 5,262,992 A    11/1993   Kondou
5,424,995 A *  6/1995   Miyazaki et al. ...... 365/230.05
5,850,359 A * 12/1998   Liu ........................... 365/156
6,366,492 B1 *  4/2002   Kawasumi ................. 365/154

FOREIGN PATENT DOCUMENTS

| JP | 7-114794   | 5/1995 |
| JP | 9-128970   | 5/1997 |
| JP | 2000-222880 | 8/2000 |

* cited by examiner

Primary Examiner—Anh Phung
(74) Attorney, Agent, or Firm—Harness, Dickey & Pierce, PLC

(57) ABSTRACT

A semiconductor memory device, that reduces load capacitance of write-only bit lines, may include: a first bit cell array block, in which bit cells thereof are defined by intersections of first bit lines and first word lines, the first bit lines being arranged as pairs of first signal lines and second signal lines, respectively; a second bit cell array block, in which bit cells thereof are defined by intersections of second bit lines and second word lines, the second bit lines being arranged as pairs of third signal lines and the second signal lines; respectively; a block division circuit operable to generate and output block division control signals; and a write bit line divider circuit operable to either open-circuit or connect together the first signal lines and the third signal lines, respectively, according to the block division control signals.

17 Claims, 3 Drawing Sheets

SEMICONDUCTOR MEMORY DEVICE WITH SELECTIVELY CONNECTABLE SEGMENTED BIT LINE MEMBER AND METHOD OF DRIVING THE SAME

CROSS REFERENCE TO RELATED APPLICATION

This application claims the priority of Korean Patent Application No. 2003-34362, filed on May 29, 2003, at the Korean Intellectual Property Office, the disclosure of which is hereby incorporated by reference in its entirety.

BACKGROUND OF THE PRESENT INVENTION

Semiconductor graphics memory devices used in liquid crystal display (LCD) products, such as a super twisted nematic (STN) thin film transistor (TFT) LCD that employs an LCD driver integrated circuit (LDI), are of a dual-port type that can perform a read/write operation through one port and a read operation through the other port. These semiconductor graphics memory devices are classified into a 6T type, a 7T type, a 8T type, based on the number of MOS field effect transistors (MOSFET) included in each bit cell. Because the 6T-type has fewer transistors that the 7T-type or 8T-type transistors, it has an advantage of being realized in a smaller chip size. Because of its smaller size advantage, the 6T type semiconductor memory device is generally used in color LDI products that require high density.

This 6T-type semiconductor memory device performs a write operation, a read operation, and a scan operation. The write operation is carried out using double-end bit lines, where two bit lines are driven to write data. The read operation is conducted using the double-end bit lines, where two bit lines are driven simultaneously to read data stored in one cell using a sense amplifier (SA) having a latch structure. Alternatively, the read operation is conducted using single-end bit lines, where a single bit line is driven to read data stored in one cell using an SA having a single-inverter structure. The scan operation includes simultaneously reading data stored in bit cells present that are commonly selected by a single word line. In general, this scan operation is carried out using the single-end bit lines and the SA having the single-inverter structure. Japanese Patent Application No. 1999-21712 discloses such a 6T-type semiconductor memory device.

FIG. 1 illustrates a typical bit cell structure 100 of the 6T-type semiconductor graphics memory device, according to the Background Art. Cell structure shown 100 uses a first bit line BL only to write a "0" datum representing a logical low value and a second bit line BLB to write, read, and scan data "1" datum representing a logical high value. As is well known, each of inverters INV1 and INV2 includes two MOSFETs.

Due to characteristics of the 6T-type semiconductor graphics memory device, the single-end bit line cannot be used for the write operation. Instead, the double-end bit line is used in the write operation. In the read operation, either the double-end bit line or the single-end bit line can be used, but it is a common practice to use the single-end bit line in order to reduce chip size and the amount of time required for testing without significantly degrading the speed of the read operation. Similarly, the single-end bit line and the SA having the single-inverter structure are used in the scan operation.

For the scan operation of the 6T-type cell structure 100, when a word line WL is activated, a MOSFET M2 (necessary for the scan operation) and a MOSFET M1 (necessary for a write operation) are turned on at the same time. As a result, undesired power consumption results via the first bit line BL. For the same reason, undesired power consumption results in the read operation as well.

FIG. 2 illustrates a typical bit cell structure 200, according to the Background Art. Bit cell structure 200 is designed to reduce load capacitance of a write bit line in a read/scan operation. Bit cell structure 200 is also designed to reduce undesired power consumption suffered by bit cell structure 100 of FIG. 1. In bit cell structure 200, during a read or scan operation, a write-only word line WL1 is not activated, rather only a read/scan-only word line WL2 is activated. Thus, undesired power consumption during the read or scan operations is reduced.

However, to realize bit cell structure 200, an additional word line is needed relative to bit cell structure 100, which increases chip size. Moreover, when using a divide-word line (DWL) structure to reduce power consumed in the write operation, a different (relative to bit cell structure 100) word line driver circuit to drive write-only word line WL1 and read/scan-only word line WL2 is needed for bit cell structure 200. Also, in terms of a design layout, gates of MOSFETs M1 and M2 of bit cell structure 100 are electrically and physically connect to the same polysilicon word line WL, and thus, MOSFETs M1 and M2 are symmetrical to each other. However, gates of MOSFETs M1 and M2 of bit cell structure 200 are driven by different metallic word lines, i.e., one for write-only word line WL1 and a separate one for read/scan-only word line WL2. As a result, MOSFETs M1 and M2 of FIG. 2 are not symmetrical, which has a drawback of low yield.

SUMMARY OF THE PRESENT INVENTION

At least one embodiment of the present invention provides a semiconductor memory device that can reduce power consumption during read/scan operations by reducing load capacitance of a write-only bit line in read/scan operations using single-end bit lines.

At least one other embodiment of the present invention provides a method of driving a semiconductor memory device that can reduce power consumption during read/scan operations by reducing load capacitance of a write-only bit line in read/scan operations using single-end bit lines.

At least one other embodiment of the present invention provides a semiconductor memory device. Such a memory device may include: a first bit cell array block, in which bit cells thereof are defined by intersections of first bit lines and first word lines, the first bit lines being arranged as pairs of first signal lines and second signal lines, respectively; a second bit cell array block, in which bit cells thereof are defined by intersections of second bit lines and second word lines, the second bit lines being arranged as pairs of third signal lines and the second signal lines; respectively; a block division circuit operable to generate and output block division control signals; and a write bit line divider circuit operable to either open-circuit or connect together the first signal lines and the third signal lines, respectively, according to the block division control signals.

Additional features and advantages of the present invention will be more fully apparent from the following detailed description of example embodiments and the accompanying drawings.

BRIEF DESCRIPTION OF THE DRAWINGS

The above and other aspects and advantages of the present invention will become more apparent by describing in detail example embodiments thereof with reference to the attached drawings in which.

Figure 1:
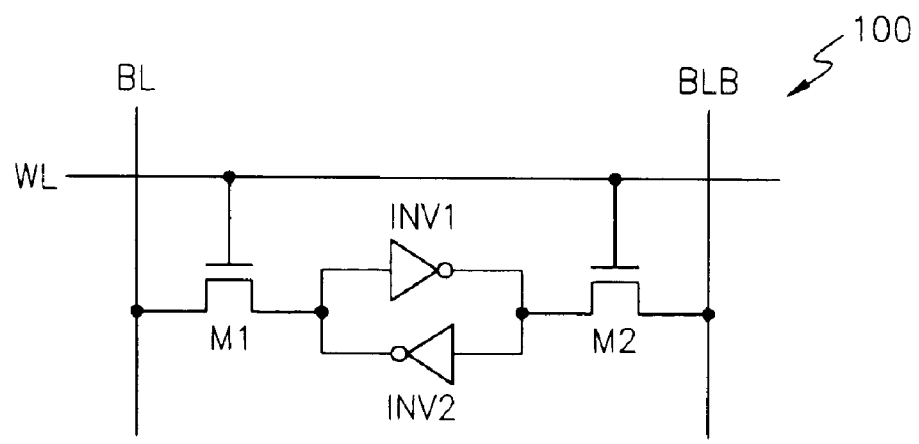
FIG. 1 illustrates a bit cell structure of a 6T-type semiconductor graphics memory device, according to the Background Art.
Figure 2:
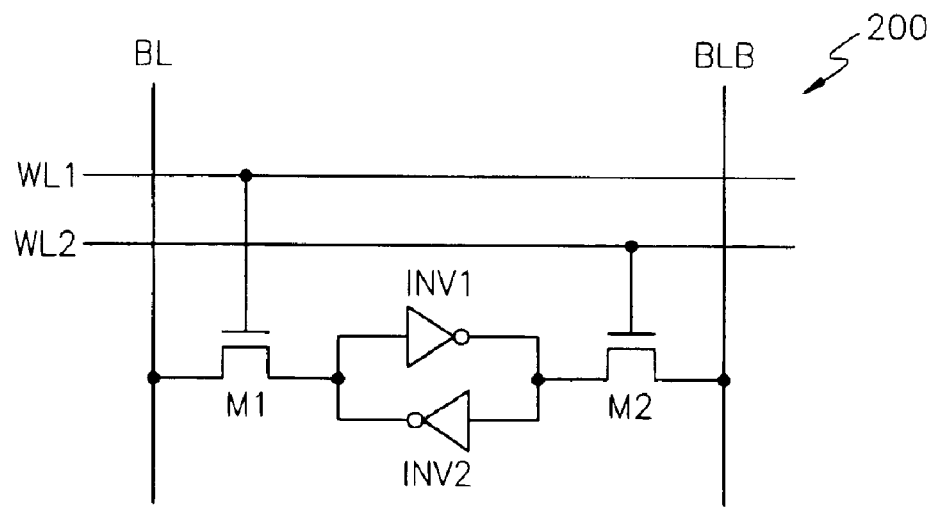
FIG. 2 illustrates a bit cell structure designed to reduce load capacitance of a write-only bit line in a read/scan operation, according to the Background Art.

The accompanying drawings are: intended to depict example embodiments of the present invention and should not be interpreted to limit the scope thereof; and not to be considered as drawn to scale unless explicitly noted.

DETAILED DESCRIPTION OF THE PRESENT INVENTION

The present invention will now be described more fully with reference to the accompanying drawings, in which example embodiments of the present invention are shown. In the drawings, like reference numerals are used to refer to like elements throughout.

Figure 3:
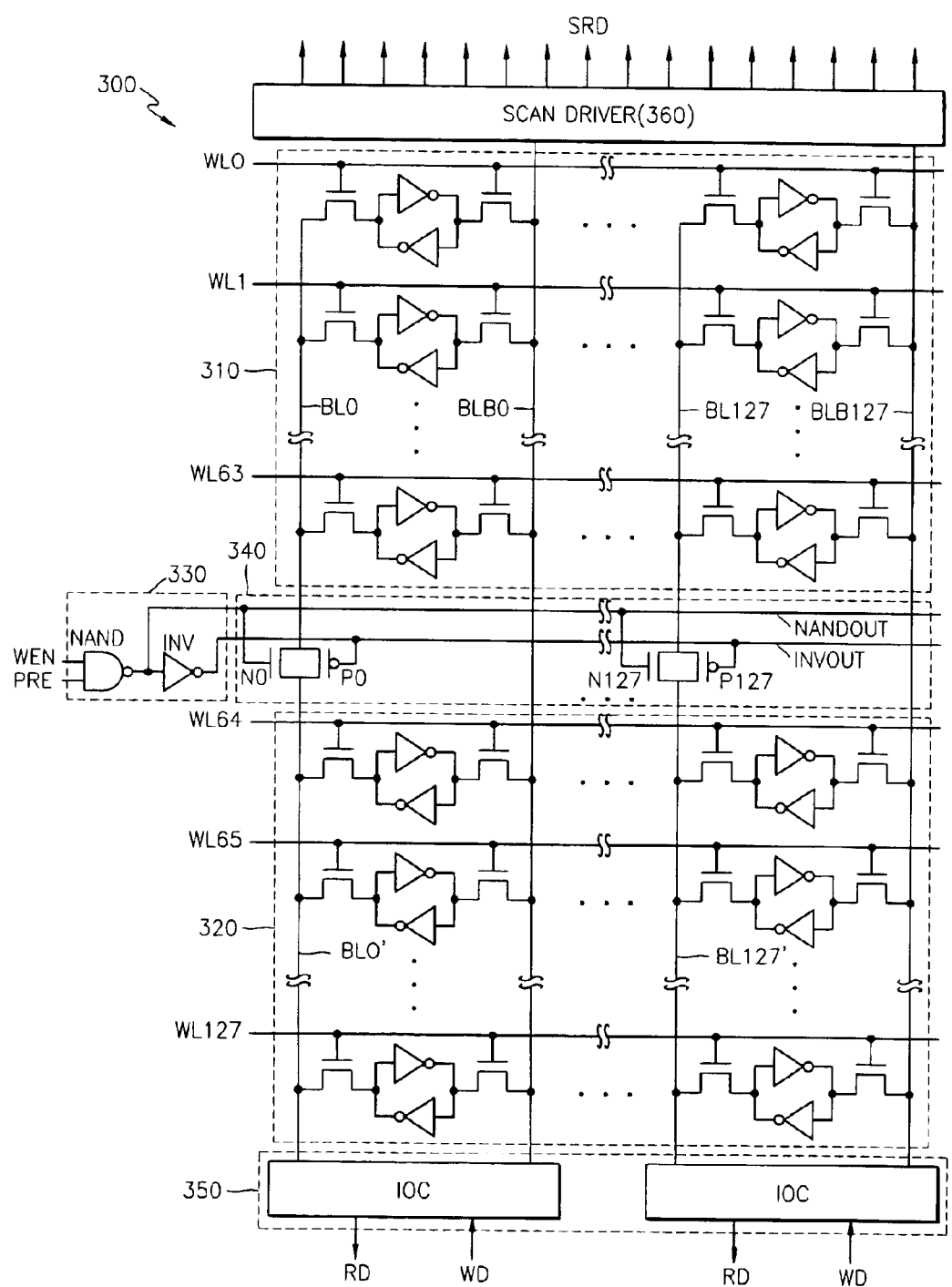
FIG. 3 illustrates the structure of a semiconductor memory device according to at least one embodiment of the present invention.

FIG. 3 illustrates the structure of a semiconductor memory device 300 according to at least one embodiment of the present invention. Device 300 includes a first bit cell array block 310, a second bit cell array block 320, a block division logic 330, a write bit line divider 340, a read/write driver 350, and a scan driver 360. Here, it is assumed that a bit cell array structure has 128 word lines including WL0, ..., WL127 and 128 bit lines. However, other numbers of word lines and/or bit lines are contemplated; hence, the present invention is not limited by the number of word lines and bit lines.

First bit cell array block 310 includes bit cells defined by the intersections of a plurality of first bit lines and a plurality of first word lines (WL0, ..., WL63. The plurality of first bit lines includes first signal lines (BL0, ..., BL127) and second signal lines (BLB0, ..., BLB127) arranged in pairs (BL0 & BLB0, ... BL127 & BLB127). First bit cell array block 310 receives and stores data during the write operation. In the read/scan operation, first bit cell array block 310 reads and outputs bit cell data. Here, the bit cells are of a 6T-type and are, e.g., illustrated as corresponding generally to cell structure 100 of FIG. 1. The first signal lines (BL0, ..., BL127) are write-only bit lines used only to write a "0" (logic low) datum to the bit cells. The second signal lines (BLB0, ..., BLB127) are used not only for the write operation to write a "1" (logic high) datum to the bit cells but also for the read operation and the scan operation.

Second bit cell array block 320 includes bit cells defined by the intersections of a plurality of second bit lines and a plurality of second word lines (WL64, ..., WL127). The plurality of second bit lines includes third signal lines (BL0', ..., BL127') and the second signal lines (BLB0, ..., BLB127) arranged in pairs (BL0' & BLB0, ... BL127' & BLB127). The third signal lines (BL0', ..., BL127') are selectively connectable to the first signal lines (BL0, ..., BL127) by write bit line driver 340. Second bit cell array block 320 receives and stores data during the write operation. During a read or scan operation, second bit cell array block 340 reads and outputs bit cell data. Here, the bit cells are of a 6T-type and, e.g., generally correspond to cell structure 100 of FIG. 1. The third signal lines (BL0', ..., BL127') are write-only bit lines used only to write a "0" (logic low) datum to the bit cells. The second signal lines (BLB0, ..., BLB127) are used not only for the write operation to write a "1" (logic high) datum to the bit cells but also for the read operation or and the scan operation.

A write operation is conducted using the double-end bit lines. More particularly, the write operation includes: loading a "0" datum onto the first signal lines (BL0, ..., BL127) and the third signal lines connected to the first signal lines (BL0, ..., BL127) for the purpose of writing a "0" datum to the bit cells; and loading a "0" datum onto the second signal lines (BLB0, ..., BLB127) for the purpose of writing a "1" datum to the bit cells. At this time, receiving and processing of input data (write data WD corresponding to respective bit lines) and outputting of write data VVD are performed by known input/output circuits IOC that are included in read/write driver 350 and which correspond to the bit lines.

A read operation is performed using single-end bit lines. Namely, the read operation includes reading bit cell data via the second signal lines (BLB0, ..., BLB127). In the read operation, read/write driver 350 senses, amplifies, and then outputs the bit cell data using an inverter that is included therein and corresponds to the bit lines. The output data (read data RD corresponding to the bit lines, respectively) is output to the outside, e.g., through a DQ pad.

A scan operation is carried out using the single-end bit lines. The scan operation includes outputting the bit cell data that has been read from all of the bit cell included in a selected word line to the second signal lines (BLB0, ..., BLB127). In the scan operation, scan driver 360 senses, amplifies, and then outputs the bit cell data using an inverter that is included therein and corresponds to the bit lines. The output data (read data SRD) is output to the outside, e.g., through a DQ pad.

In the write operation, the read operation, or the scan operation, a word line is generally selected by an X-decoder, and a bit line is selected by a Y-decoder. If a word line is selected by the X-decoder, then this induces a state in which data can be written to or read from corresponding bit cells. In this state, corresponding bit lines are selected by the Y-decoder, thus resulting in the loading of write data into the selected bit lines or the sensing, amplifying, and outputting of data read from the selected bit cells.

Block division logic 330 creates and outputs block division control signals NANDOUT and INVOUT that are activated in the write operation or bit line precharge operation and deactivated in other operations. Here, precharging of the bit lines is to be understood as charging the bit lines with a supply voltage VDD (representing a logic high value) value or charging the bit lines to a supply voltage VSS (representing a logic low value) prior to the write operation, the read operation, or the scan operation. The precharging voltage may be set to another value according to the design process, e.g., VDD/2 instead of VDD.

Block division logic 330 includes a circuit representing NAND logic and a circuit representing logical inverter (INV) logic. The NAND logic receives a precharging signal PRE activated in the precharging operation and a write enable signal WEN activated in the write operation, performs a NAND operation on the precharging signal PRE and the write enable signal WEN, and then outputs a first of two block division control signals, namely signal NANDOUT.

The INV logic receives the first block division control signal NANDOUT, inverts the logic state of the first block division control signal NANDOUT, and outputs the second of the two block division control signals, namely signal INVOUT.

Write bit line divider 340 selectively open-circuits or connects together the first signal lines and the third signal lines, respectively, in response to the block division control signals NANDOUT and INVOUT. In more detail, write bit line divider 340 includes pairs of an NMOSFET (e.g., Ni) and a PMOSFET (e.g., Pi) between the first signal lines (BL0, . . . , WL127) and the third signal lines (BLB0', . . . , BLB127'), e.g., a pair N0 & P0 selectively connects first signal line BL0 to third signal line BL0'. Here, NMOSFETs (N0, . . . , N127) receive the first block division control signal NANDOUT through their gates. Also, PMOSFETs (P0, . . . , P127) receive the second block division control signal INVOUT through their gates.

Stated differently, corresponding instances of the first and third signal lines can be thought of as corresponding segments. Such corresponding segments represent selectively connectable segmented signal members.

During the write operation or the bit line precharge operation, write bit line divider 340 connects together (or, in other words, short-circuits) the first signal lines and the third signal lines, respectively. During the rad operation or the scan operation, write bit line divider 340 does not connect together (or, in other words, open-circuits) the first signal lines and the third signal lines. Consequently, load capacitance of the write-only bit line corresponds to a first line and a third line selectively connectable together) are reduced in the read or scan operation performed using the single-end bit lines, resulting in a decrease in power consumed in the read or scan operation. Such a relationship is illustrated in Table 1 (below), where an active state indicates logic low ("0") and a non-active state indicates logic high ("1").

TABLE 1

| WEN | PRE | State of write-only bit line |
| --- | --- | --- |
| Inactive ("1") | Inactive ("1") | Open-circuited |
| Inactive ("1") | Active ("0") | Short-circuited |
| Active ("0") | Inactive ("1") | Short-circuited |
| Active ("0") | Active ("0") | Short-circuited |

Figure 4:
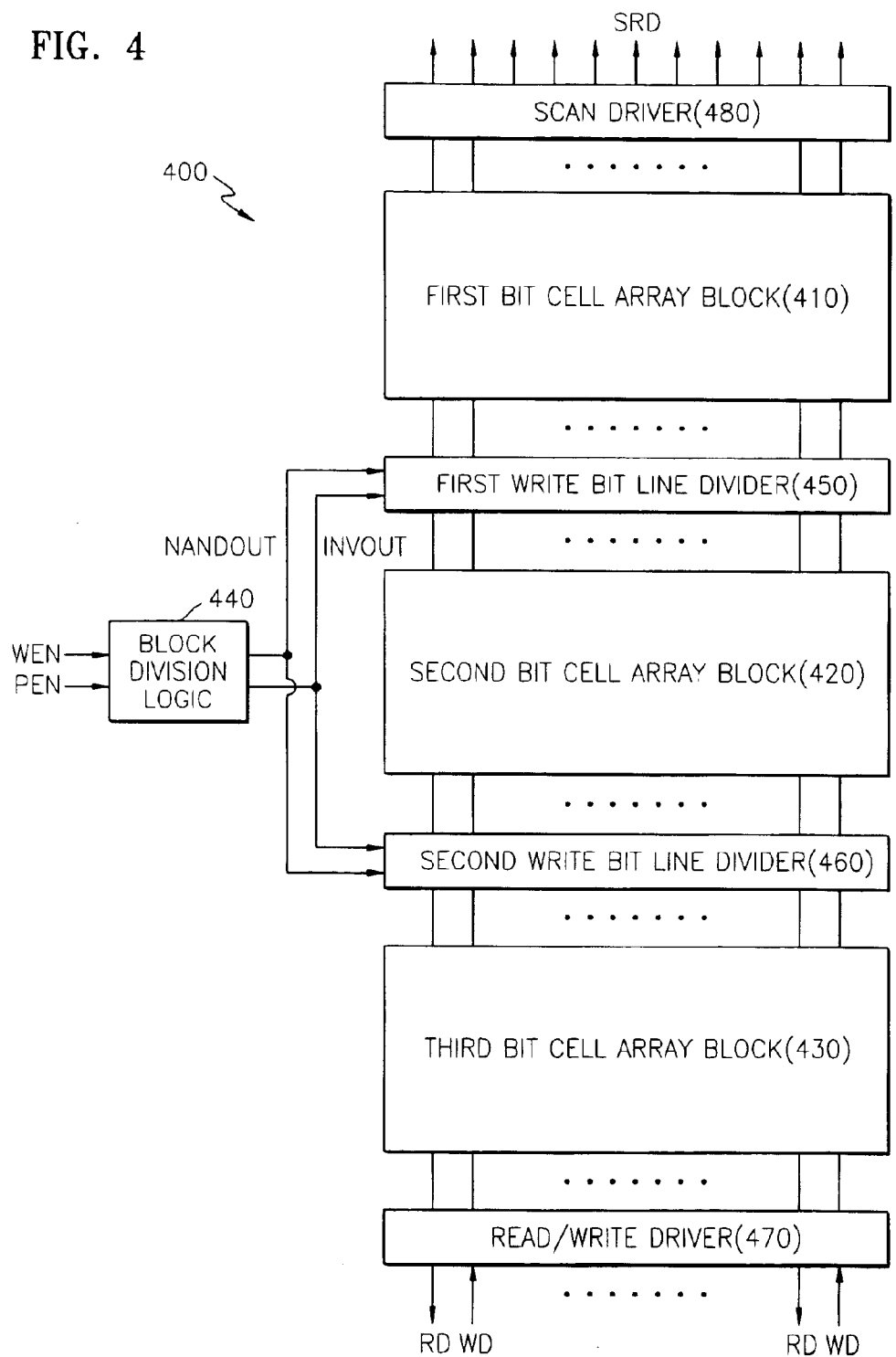
FIG. 4 illustrates the structure of a semiconductor memory device according to at least one other embodiment of the present invention.

FIG. 4 illustrates the structure of a semiconductor memory device 400 according to at least one other embodiment of the present invention. Device 400 includes: at least three bit cell array blocks, e.g., a first bit cell array block 410, a second bit cell array block 420, and a third bit cell array block 430; at least two write bit line dividers, e.g., a first write bit line divider 450 and a second write bit line divider 460; and block division logic 440. Additional bit cell block arrays, etc., can be added depending upon the circumstances in which device 400 is used.

Configurations of first bit cell array block 410, second bit cell block 420, and third bit cell array block 430 can be the same as that of first bit cell array block 310 or second bit cell array block 320 of FIG. 3. Also, the configuration of block division logic 440 can be the same as that of block division logic 330 of FIG. 3. The configurations of first write bit line divider 450 and second write bit line divider 460 can be the same as that of write bit line divider 350 of FIG. 3. Device 400 also includes a read/write driver 470 and a scan driver 480 whose configurations can be the same as those of read/write driver 350 and scan driver 360 of FIG. 3, respectively.

Block division logic 440 precharges the bit lines or generates and outputs block division control signals NANDOUT and INVOUT that are activated in the write operation and are deactivated in other operations. First write bit line divider 450 either open-circuits or connects together the write-only bit lines of first bit cell array block 410 and the write-only bit lines of second bit cell array block 420 in response to the block division control signals NANDOUT and INVOUT. Also, in response to the block division control signals NANDOUT and INVOUT, second write bit line divider 460 either open-circuits or connects together the write-only bit lines of second cell array block 420 and the write-only bit lines of third bit cell array block 430.

Write-only bit lines of first bit cell array block 410 correspond to the first signal lines (BL0, . . . , WL127) of FIG. 3 and the write-only bit lines of the second cell array block 420 correspond to the third signal lines (BL0', . . . , BL127') of FIG. 3, which are selectively connected together by write bit line diver 340.

Third bit cell array block 430 includes bit cells defined by the intersections of a plurality of third bit lines and a plurality of third word lines (WL0, . . . , WL63). The plurality of third bit lines includes fourth signal lines (BL0", . . . , BL127") and the second signal lines (BLB0, . . . , BLB127) arranged in pairs (BL0" & BLB0, . . . BL127" & BLB127). The fourth signal lines (BL0", . . . , BL127") are selectively connectable to the third signal lines (BL0', . . . , BL127') by second write bit line divider 460. Third bit cell array block 430 receives and stores data to the bit cell(s) in the write operation using the double-end bit lines. In the read/scan operation, third bit cell array block 430 reads and outputs bit cell data using the single-end bit lines.

Read/write driver 470 receives and processes input data in the write operation and outputs the write data. In the read operation, read/write driver 470 senses, amplifies, and then outputs the bit cell data. Also, scan driver 480 senses, amplifies, and then outputs the bit cell data in the scan operation.

As pointed out above, a semiconductor memory device according to embodiments of the present invention includes block division logic (e.g., 330 or 440) that generates and outputs block division control signals NANDOUT and INVOUT that can be activated during the write operation and during the bit line precharge operation and can be deactivated in other operations. Also, such a device includes a write bit line divider (e.g., 340, 450, or 460) that either open-circuits or connects together the write-only bit lines of several bit cell array blocks in response to the block division control signals NANDOUT and INVOUT. Thus, in the read or scan operation using the single-end bit lines, load capacitance of the write-only bit line can be reduced. In practice, power consumption of such a device can be reduced by up to about 20% as compared with a corresponding semiconductor memory device according to the Background Art.

Also, as the number of bit cell array blocks in a semiconductor memory device (according to embodiments of the present invention) increases, more reduction in power consumption can be obtained. Also, when such a device is compared with a corresponding semiconductor memory device according to the Background Art, chip size does not increase as much due to a relatively simpler layout and/or operating speed does not decrease as much.

As described above, a semiconductor memory device according to at least one embodiment of the present invention can: reduce load capacitance of the write-only bit line in the read/scan operation using the single-end bit lines, which can reduce power consumed in the read/scan operation; enjoy relatively reduced chip size; and exhibit yield in production thereof that is relatively increased.

While the present invention has been particularly shown and described with reference to example embodiments thereof, it will be understood by those of ordinary skill in the art that various changes in form and details may be made therein without departing from the spirit and scope of the present invention.

The present invention being thus described, it will be obvious that the same may be varied in many ways. Such variations are not to be regarded as a departure from the spirit and scope of the present invention, and all such modifications are intended to be included within the scope of the present invention.

What is claimed is:

1. A semiconductor memory device comprising:
    a first bit cell array block, in which bit cells thereof are defined by intersections of first bit lines and first word lines, the first bit lines being arranged as pairs of first signal lines and second signal lines, respectively;
    a second bit cell array block, in which bit cells thereof are defined by intersections of second bit lines and second word lines, the second bit lines being arranged as pairs of third signal lines and the second signal lines; respectively;
    a block division circuit operable to generate and output block division control signals; and
    a write bit line divider circuit operable to either open-circuit or connect together the first signal lines and the third signal lines, respectively, according to the block division control signals.

2. The semiconductor memory device of claim 1, further comprising:
    a read/write driver operable during a write operation to receive and to process input data and to output as a result thereof write data, and operable during a read operation to sense, to amplify, and then to output bit cell data; and
    a scan driver operable during a scan operation to sense, to amplify, and to output the bit cell data.

3. The semiconductor memory device of claim 1, wherein:
    the first bit cell array block is operable to receive and to store write data during a write operation, and to read and to output bit cell data during a read or a scan operation; and
    the second bit cell array block is operable to receive and to store write data during the write operation, and to read and to output bit cell data during the read or the scan operation.

4. The semiconductor memory device of claim 1, further comprising:
    a third bit cell array block, in which bit cells thereof are defined by intersections of third bit lines and third word lines, the third bit lines being arranged as pairs of fourth signal lines and the second signal lines; respectively; and
    a second write bit line divider circuit operable to either open-circuit or connect together the third signal lines and the fourth signal lines, respectively, according to the block division control signals.

5. The semiconductor memory device of claim 4, wherein:
    the third bit cell array block is operable to receive and to store write data during a write operation, and to read and to output bit cell data during a read operation or a scan operation.

6. The semiconductor memory device of claim 1, wherein the block division circuit is operable to generate the block division control signals based upon a precharging signal activated during a precharging operation and a write enable signal activated during a write operation.

7. The semiconductor memory device of claim 6, wherein the block division circuit includes:
    a NAND circuit operable to perform a NAND operation on the precharging signal and the write enable signal and to output as a result a first one of the block division control signals; and
    a logical inverter circuit, which receives and inverts the first one of the block division control signals outputs as a result a second one of the block division control signals.

8. The semiconductor memory device of claim 7, wherein the write bit line divider comprises:
    a plurality of NMOSFETs, which receive the first one of the block division control signals through gates thereof, operable to either open-circuit or connect together the first signal lines and the third signal lines, respectively, based upon the first one of the block division control signals; and
    a plurality of PMOSFETs, which receive the second one of the block division control signals through gates thereof, operable to either open-circuit or connect together the first signal lines and the third signal lines, respectively, based upon the second one of the block division control signals.

9. The semiconductor memory device of claim 1, wherein a write operation is performed using double-end bit lines.

10. The semiconductor memory device of claim 1, wherein a read operation is performed using single-end bit lines.

11. The semiconductor memory device of claim 1, wherein a scan operation is performed using single-end bit lines.

12. The semiconductor memory device of claim 1, wherein the bit cells are of a 6T type.

13. A method of driving a semiconductor memory device, the method comprising:
    providing a first bit cell array block and a second cell array block;
    defining bit cells in the first bit cell array block by intersections of first bit lines and first word lines, the first bit lines being arranged as pairs of first signal lines and second signal lines, respectively;
    defining bit cells in the second bit cell array block by intersections of second bit lines and second word lines, the second bit lines being arranged as pairs of third signal lines and the second signal lines; respectively;
    generating block division control signals; and
    selectively open-circuiting or connecting together the first signal lines and the third signal lines, respectively, according to the block division control signals.

14. The method of claim 13, further comprising:
    operating during a write mode by receiving and processing input data and outputting as a result thereof write data;
    operating during a read mode by sensing, amplifying, and then outputting bit cell data; and
    operating during a scan mode by sensing, amplifying, and then outputting the bit cell data.

15. The method of claim 13, further comprising:

providing a third bit cell array block;

defining bit cells in the third bit cell array block by intersections of third bit lines and third word lines, the third bit lines being arranged as pairs of fourth signal lines and the second signal lines, respectively; and selectively open-circuiting or connecting together the fourth signal lines and the third signal lines, respectively, according to the block division control signals.

16. The method of claim 13, wherein the generating of the block division control signals includes generating the block division control signals based upon a precharging signal activated during a precharging operation and a write enable signal activated during a write operation.

17. The method of claim 16, further comprising:

performing a NAND operation on the precharging signal and the write enable signal and outputting as a result a first one of the block division control signals; and inverting the first one of the block division control signals and outputting as a result a second one of the block division control signals.

* * * * *